(12) United States Patent
Morein

(10) Patent No.: US 7,869,293 B2
(45) Date of Patent: Jan. 11, 2011

(54) MEMORY SENSE SCAN CIRCUIT AND TEST INTERFACE

(75) Inventor: Stephen L. Morein, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 401 days.

(21) Appl. No.: 11/863,972

(22) Filed: Sep. 28, 2007

(65) Prior Publication Data
US 2009/0089632 A1   Apr. 2, 2009

(51) Int. Cl.
G11C 7/00 (2006.01)
(52) U.S. Cl. .................. 365/205; 365/203
(58) Field of Classification Search .......... 714/726; 327/202; 365/203, 205
See application file for complete search history.

(56) References Cited

U.S. PATENT DOCUMENTS

| | | | | |
|---|---|---|---|---|
| 5,414,714 A * | 5/1995 | Gladden et al. | ............. | 714/731 |
| 5,485,466 A * | 1/1996 | Lyon et al. | ............. | 714/731 |
| 5,958,075 A * | 9/1999 | Wendell | ............. | 714/726 |
| 6,111,794 A * | 8/2000 | Holst | ............. | 365/190 |
| 6,459,317 B1 * | 10/2002 | Lu et al. | ............. | 327/217 |
| 7,317,636 B2 * | 1/2008 | Ide et al. | ............. | 365/185.22 |
| 7,514,975 B2 * | 4/2009 | Frederick et al. | ............. | 327/202 |
| 7,560,965 B2 * | 7/2009 | Waldrip et al. | ............. | 327/202 |

* cited by examiner

Primary Examiner—James C Kerveros
(74) Attorney, Agent, or Firm—Courtney IP Law

(57) ABSTRACT

A scannable IO circuit featuring reduced latch count for pipelined memory architectures and test methodology. For a pipelined memory system performing at speed tests, the timing sequence for processing a test command includes a precharge-read-precharge-write sequence for each clock cycle starting with the rising clock edge. The memory circuit utilizing this test command timing sequence comprises a sense amplifier and a single latch. The sense amplifier itself is used as a latch to implement scan functionality for the memory circuit. The memory device is incorporated into an integrated test wrapper circuit that executes back-to-back commands through serial compare operations using integrated scan flip-flop circuits. The test wrapper includes a fanout block and padded address scheme for testing multiple and disparate size memory devices in parallel.

10 Claims, 14 Drawing Sheets

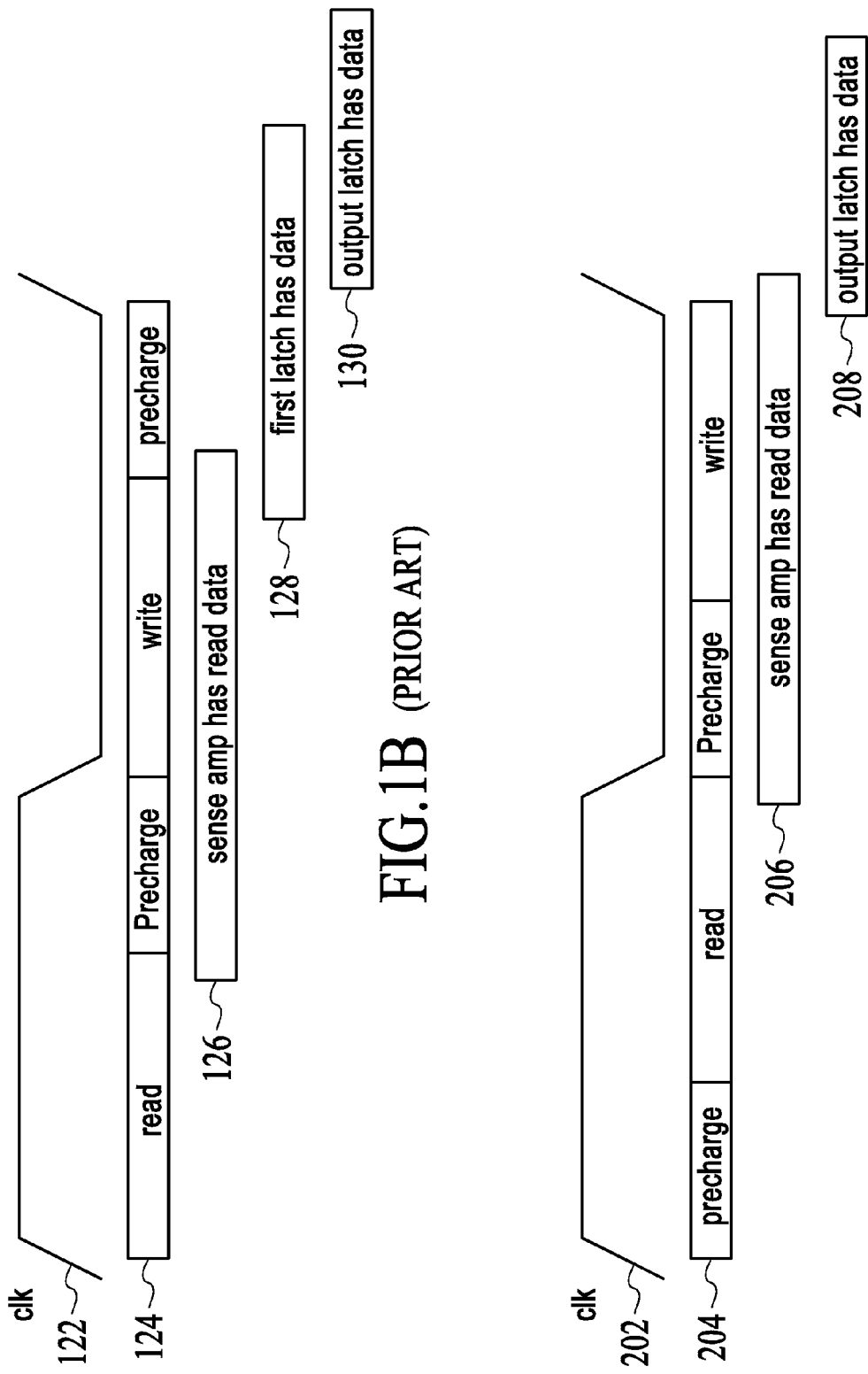

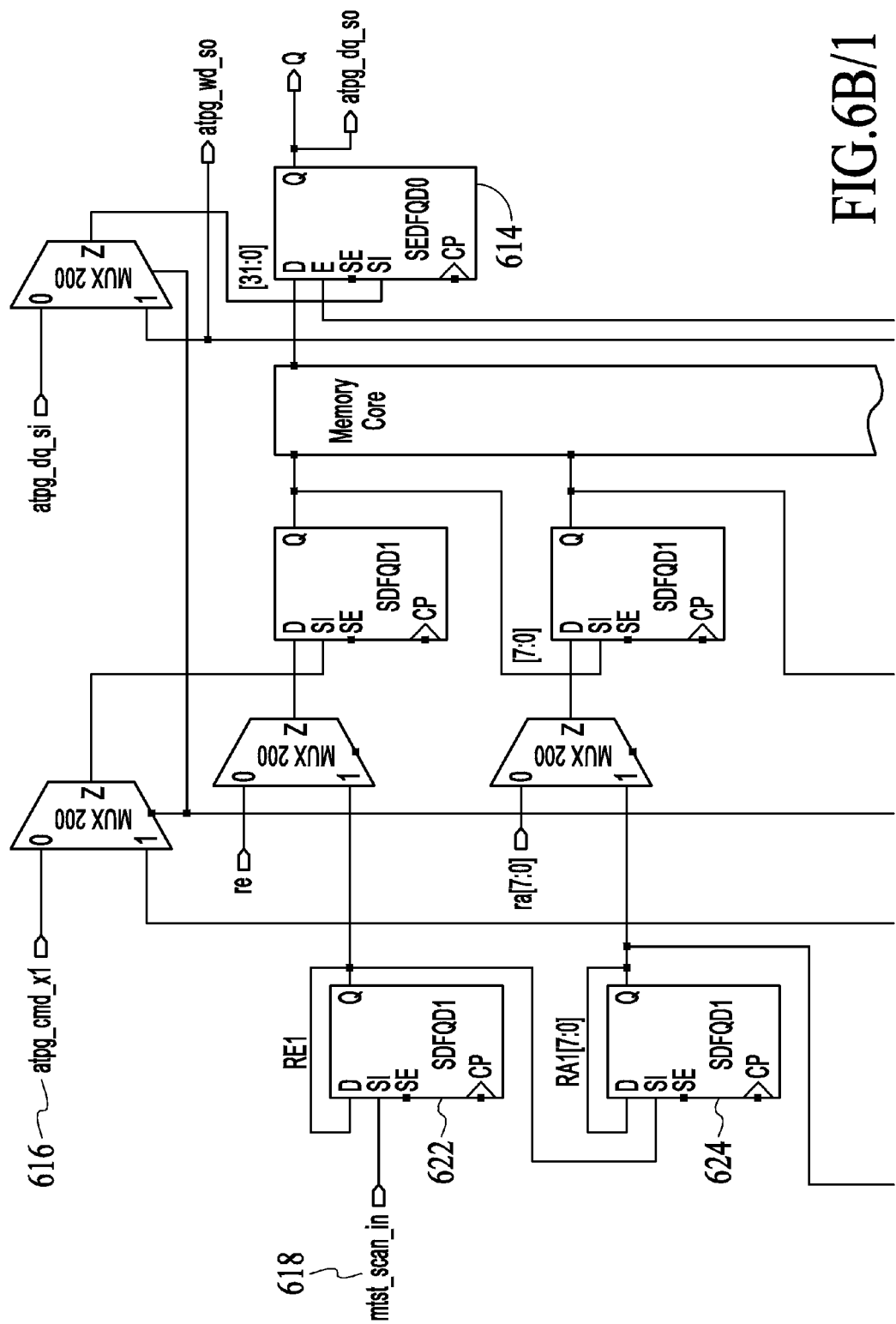
FIG.6B/1

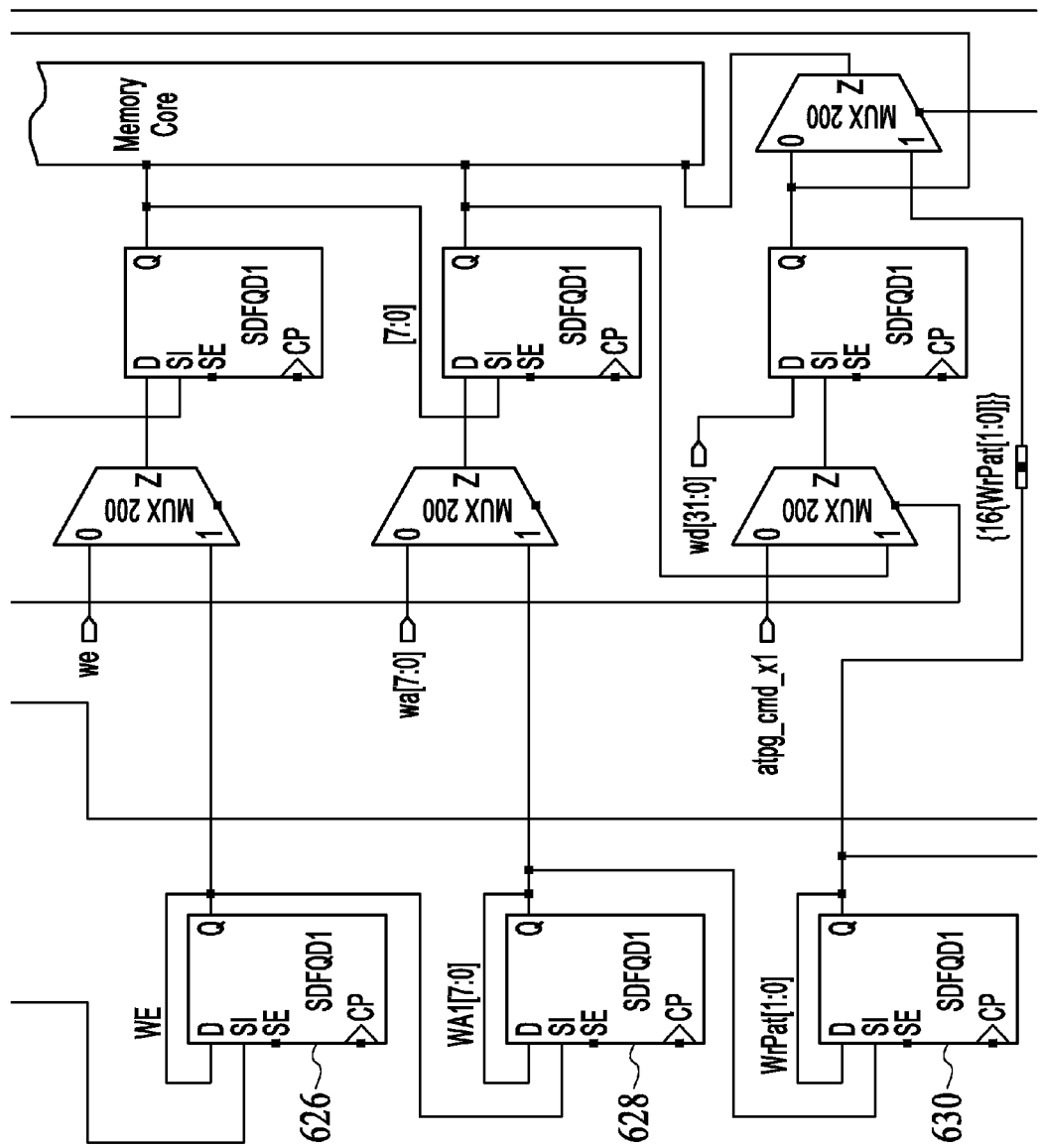
FIG. 6B/2

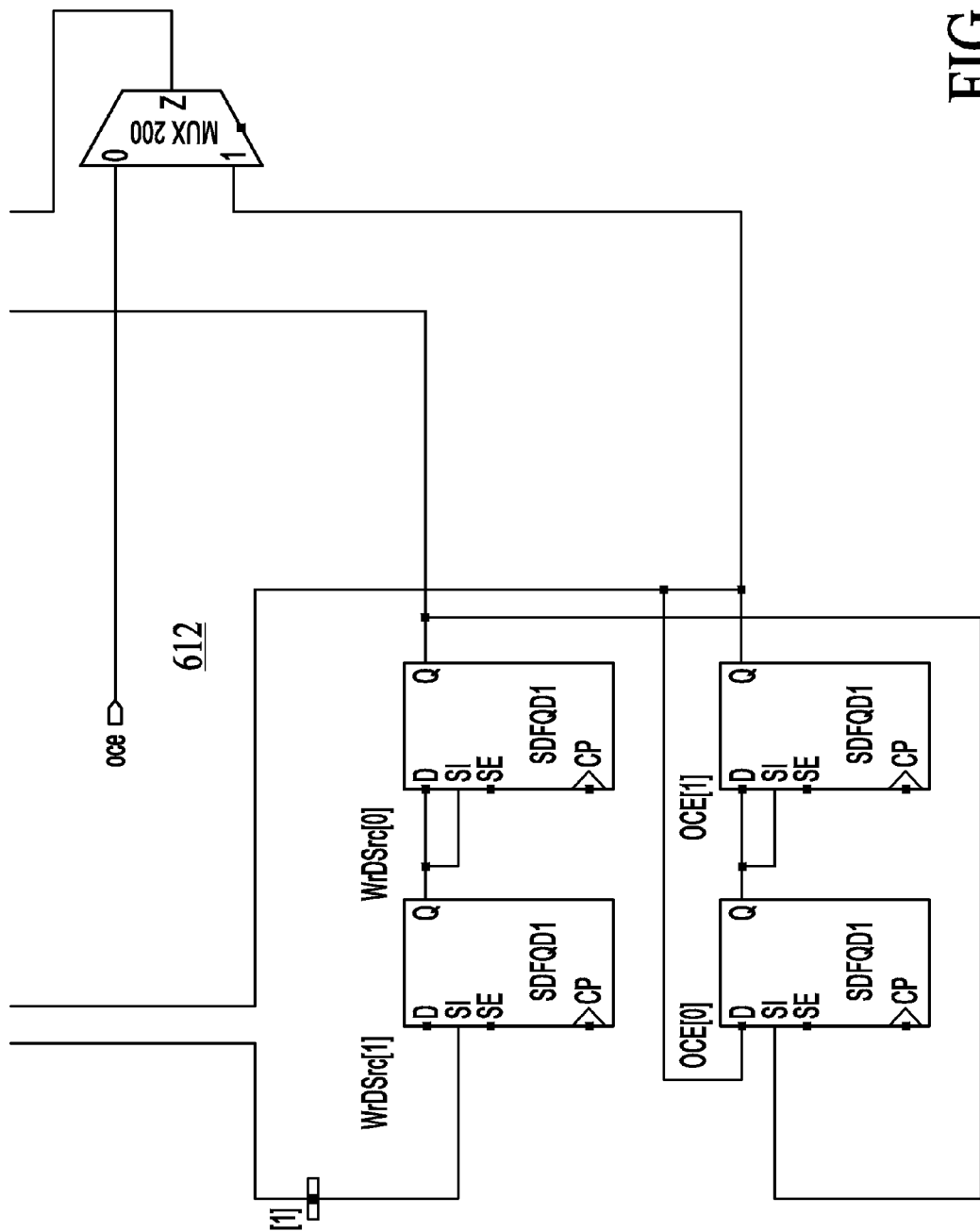
FIG.6B/3

US 7,869,293 B2

MEMORY SENSE SCAN CIRCUIT AND TEST INTERFACE

FIELD

Embodiments of the invention relate generally to memory devices, and more specifically to circuits and processes for memory scan and test procedures.

BACKGROUND

A sense amplifier generally senses the value of a bit stored in a memory cell of a RAM (random access memory) integrated circuit. Sense amplifier performance has a significant effect on memory access time and power use, consequently they are relatively critical circuits in the periphery of RAM devices. Most memory input/output (IO) circuits consist of a sense amplifier followed by a latch. If the memory is pipelined then this output latch is followed by at least another latch, if not a full flip-flop circuit. FIG. 1A is a circuit diagram of a memory circuit with a sense amplifier as known in the prior art. Circuit 100 includes a memory cell 106, pre-charge circuit 106, isolation circuit 104, and sense amplifier 102. Circuit 100 represents a cross-section of the read data path for a single column for a typical RAM memory array. Sense amplifier 102 examines the bit line 101 to determine whether a logic 1 or logic 0 is stored in cell 106. The sense amplifier 102 is activated when the Set Sense Amp (SSA) signal 103 goes high. Proper timing of the SSA signal is critical as it is used to determine when the data on the bit lines is sensed. Incorrect timing of this signal can lead to memory errors even when the correct binary value may be stored in the cell 106. For implementation within a multi-cell memory array, each sense amplifier is followed by one or more latch or flip-flop circuits (not shown).

Many memory devices feature scannable IO to facilitate boundary scan testing in which interconnects and memory circuits are tested without the use of physical test probes. Test cells are connected to each pin of a memory device to selectively override the functionality of that pin. The boundary scan latch cells are configured so that in normal mode, they have no effect on circuit operation, and in test mode, they enable a data stream to be passed from one latch to the next. For scannable IO, any output latch or flip-flop circuit must also be scannable.

Scannable IO circuits are used extensively in pseudo-dual port (pdp) memory architectures in which the memory array is accessed twice within the same cycle using a memory precharge—data transfer cycle. FIG. 1B illustrates a known memory access cycle for a typical pdp memory device. For a single cycle of the clock signal 122, the memory is accessed in a Read/Precharge/Write/Precharge sequence 124. The sense amplifier circuit is activated at the end of the read cycle and has the read data, 126, and at some point before the end of the clock cycle, the data is stored in a latch, 128. For a pipelined memory, the data should be output from the memory at the end of the clock cycle 122. However, for the timing shown in FIG. 1B, it is not possible to hold the data in the sense amplifier until that time, because of the need to precharge the sense amplifier in preparation for the next read. The precharge cycle puts the bits in a state where they can be read. This requires the use of an output latch to store the data prior to a new read cycle, 110. This results in the need for three storage elements, the sense amplifier, the first latch 128 and the second latch (output) 130 connected to the output pin. The sense amplifier holds the valid data from the point where it is successfully sensed, until it is precharged. The first latch holds the data until some time after the data is sensed after the clock edge, and the second latch holds the data from edge to edge. In many current scannable memory 10 circuits, the output latch is a conventional multiplexed flip-flop circuit. Alternative known circuits may employ a dual flip-flop in place of the output latch, in which case the scan circuit comprises a sense amplifier and three latches. Such circuits add significant complexity to the memory 10 stage and can take up significant chip space in the finished integrated circuit (IC) device.

Significant space on memory IC's can also be taken up by circuitry that facilitates in-circuit or self-testing of memory devices. Current systems that perform built-in self-test (BIST) functionality generally implement area intensive parallel tests that can consume significant die area in memory IC's.

BRIEF DESCRIPTION OF THE DRAWINGS

Embodiments of the present invention are illustrated by way of example and not limitation in the figures of the accompanying drawings, in which like references indicate similar elements and in which:

FIG. 1B illustrates a known memory access cycle for a typical pdp memory device.

FIG. 2 illustrates a memory timing cycle for a memory sense scan circuit, under an embodiment.

FIG. 6B illustrates the memory circuit of FIG. 5 including a fully integrated test wrapper, under an embodiment.

DETAILED DESCRIPTION

Figure 1A:
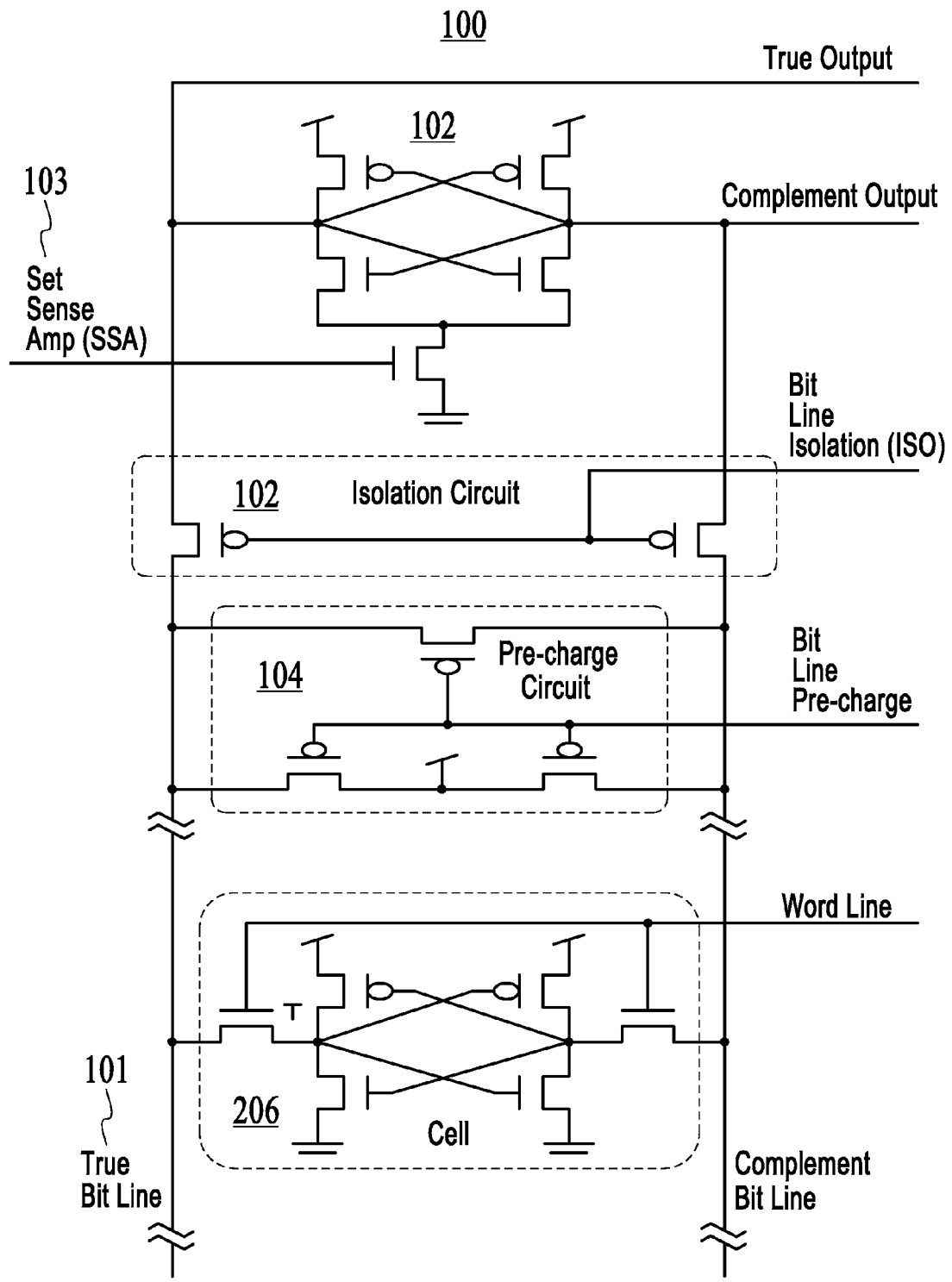
FIG. 1A is a circuit diagram of a memory circuit with a sense amplifier as known in the prior art.

Embodiments of a scannable IO circuit featuring reduced latch count for pipelined memory architectures are described. A unique test methodology and test wrapper for such a circuit is also described. For a pipelined memory system performing at speed tests, the timing sequence for processing a test command comprises a precharge-read-precharge-write sequence for each clock cycle starting with the rising clock edge. The memory circuit utilizing this test command timing sequence comprises a sense amplifier and a single latch. The sense amplifier itself is used as a latch to implement scan functionality for the memory circuit. This significantly reduces the chip space required as compared to conventional sense amplifier circuits that utilize a flip-flop circuit as part of the output latch circuit.

In certain implementations, the memory device featuring a simplified output latch circuit is incorporated into an integrated test wrapper circuit that executes back-to-back commands through serial compare operations using integrated scan flip-flop circuits. The test wrapper includes a fanout block and padded address scheme for testing multiple and disparate size memory devices in parallel.

In the following description, numerous specific details are introduced to provide a thorough understanding of, and enabling description for, embodiments of the memory sense scan circuit and integrated memory test wrapper system. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments.

Current scannable memory systems that execute built-in self-test (BIST) routines typically require a significant number of extra latches to properly latch read/write data during each clock cycle when processing sequential test commands consisting of test vectors. In one embodiment, the conventional timing sequence illustrated in FIG. 1B is modified to facilitate the use of a memory sense scan circuit that features a reduced latch count and space requirement. FIG. 2 illustrates a memory timing cycle for a memory sense scan circuit, under an embodiment. As shown in FIG. 2, the memory timing is modified to a Precharge-Read-Precharge-Write sequence 204 for a clock cycle 202. The order of operations is fundamentally the same as in present systems, however, the relationship to the clock signal 204 is changed. It is essentially shifted back in time to delay the period of time in which the sense amplifier has read data until the rising clock edge. The sense amplifier holds the data until the end of the clock period, 206. This delays the precharge requirement until the beginning of the next cycle, unlike present systems in which the sense amplifier only holds the data until the start of the second precharge, and requires latches to hold the data for till the beginning of the new clock cycle. Although the timing shown in FIG. 2 delays the read operation, for a pipelined memory delaying the read does not affect memory timing since the read data is not required until after the rising clock edge. As shown in FIG. 2, once the sense amp had the read data 206 it is passed to an output latch 208. This scheme requires only a single latch, thus reducing the memory sense scan circuit to a sense amplifier and one latch. In one embodiment, the timing diagram of FIG. 2 illustrates a memory circuit that is configured to operate in pseudo-dual pumped memory in which the clock is operated at twice the normal operating frequency so that read and write operations operate in single cycles.

Figure 3:
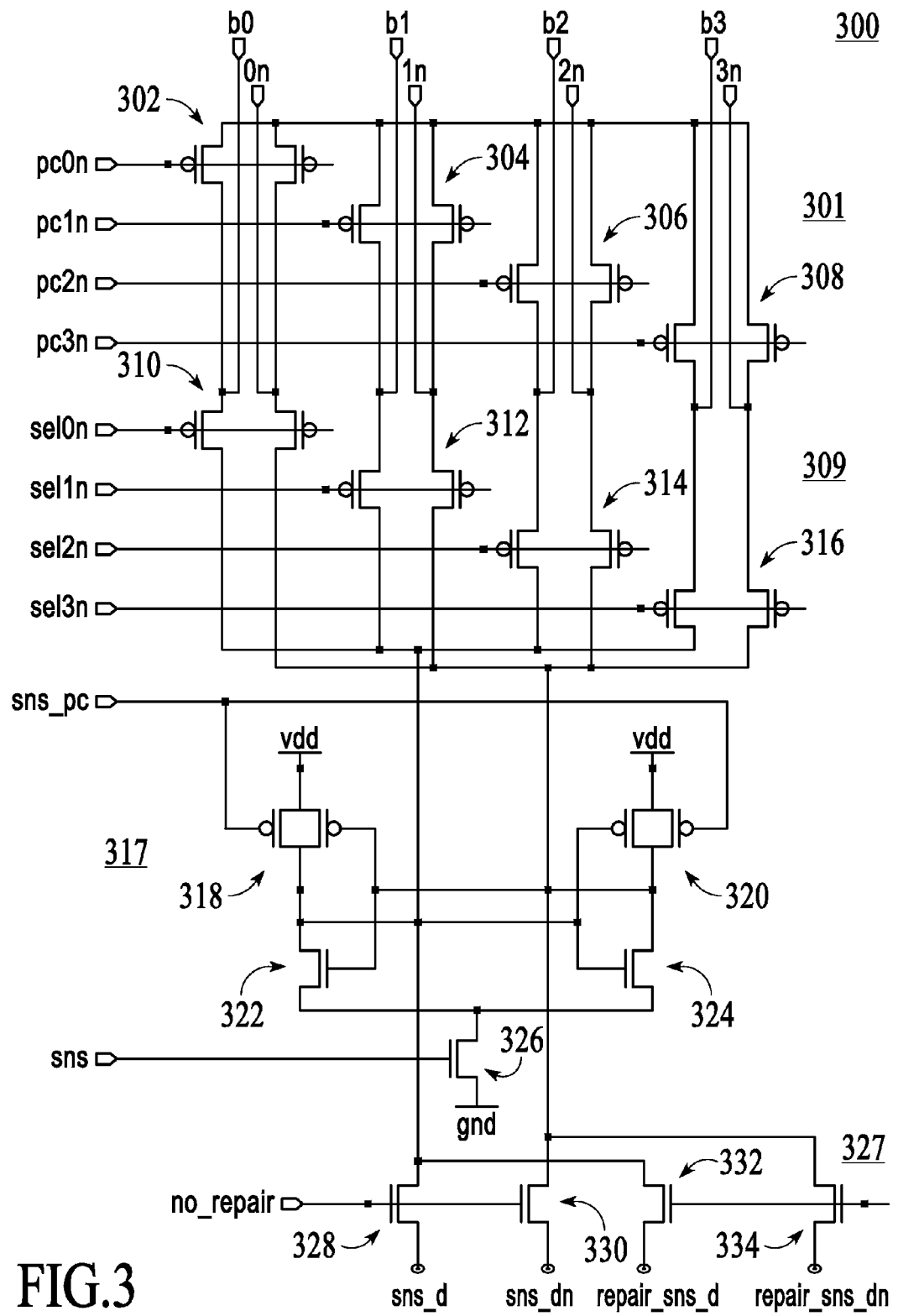
FIG. 3 is a transistor-level illustration of a memory sense scan circuit, under an embodiment.

In one embodiment, the sense amplifier itself is a latch that is also utilized to implement the scan functionality. FIG. 3 is a transistor-level illustration of a memory sense scan circuit, under an embodiment. Circuit 300 illustrates the memory sense scan circuit through a column-multiplexed four-bit memory with bitlines connected to a read path, and that supports memory repair. The memory is typically used in pipeline mode, which requires the data to be valid for a full clock cycle. Each bit line, denoted b0-b3 is input through a differential transistor pair and is then subject to precharge equalization signals prior to input to a sense amplifier circuit.

As shown in FIG. 3, the top level of transistors 301 comprising transistor pairs 302, 304, 306, and 308 are the precharge lines that are driven by pcXn (pc0n, pc1n, pc2n, and pc3n) signals. These transistors are used to restore the bitlines to the supply voltage ($V_{dd}$) level. The second set of transistors comprising transistor pairs 310, 312, 314, and 316 comprise the read column multiplexer circuit 309, and are drives by respective se/xn signals (sel0n, sel1n, sel2n, and sel3n). These transistors select which of the four bitlines b0-b3 are connected to the sense amplifier circuit 317. The sense amplifier stage 317 consists of two precharge transistors 318 and 320 driven by a sns_pc signal and cross-coupled sense amplifier transistors 322 and 324 with a tail transistor 326 driven by the sns signal.

The general operation of the sense amplifier of circuit 300 is for it to be initially in a precharged state, with both bitlines raised to $V_{dd}$. For normal memory operation, the column multiplexer 309 is used to connect the sense amplifier 317 to one of the bitline pairs. The precharge cycle is terminated and a small voltage differential is developed on the bitlines, and passed on to the sense amplifier 317 through the column multiplexer 309. To sense the data, the sense amplifier is disconnected from the bitline, and the sns signal is driven to a logic high state. The cross-coupled NMOS transistors then rapidly amplify the difference between the bitlines until a full swing signal is developed. The cross-coupled PMOS transistors help to develop the full swing signal.

The fourth stage of circuit 300 is a repair multiplexer stage 327 that comprises transistors 328, 330, 332, and 334. This stage is used to connect a number, N+1 sense amplifiers and bitlines to N output latches. This allows a faulty bit, bitline, or sense amplifier to be bypassed. In one embodiment, the repair multiplexer stage 327 is a bidirectional multiplexer to facilitate the transmission of scan signals to and from the memory circuit 300. The sense amplifier circuit 317 is used as the first latch in the scan flip-flop circuit. The use of a sense amplifier that functions as a latch in combination of a repair multiplexer stage that is bidirectional adds scan-ability to memory circuits that are not scannable, or maintains scan-ability while allowing the reduction of circuitry.

FIG. 3 illustrates a sense amplifier circuit for a read path. It should be noted that a similar circuit is used for a write path. In one embodiment, the sense amplifier circuit 317 comprises the first latch in the scan flip-flop circuit, thus reducing the space required on the manufactured IC device.

Figure 4:
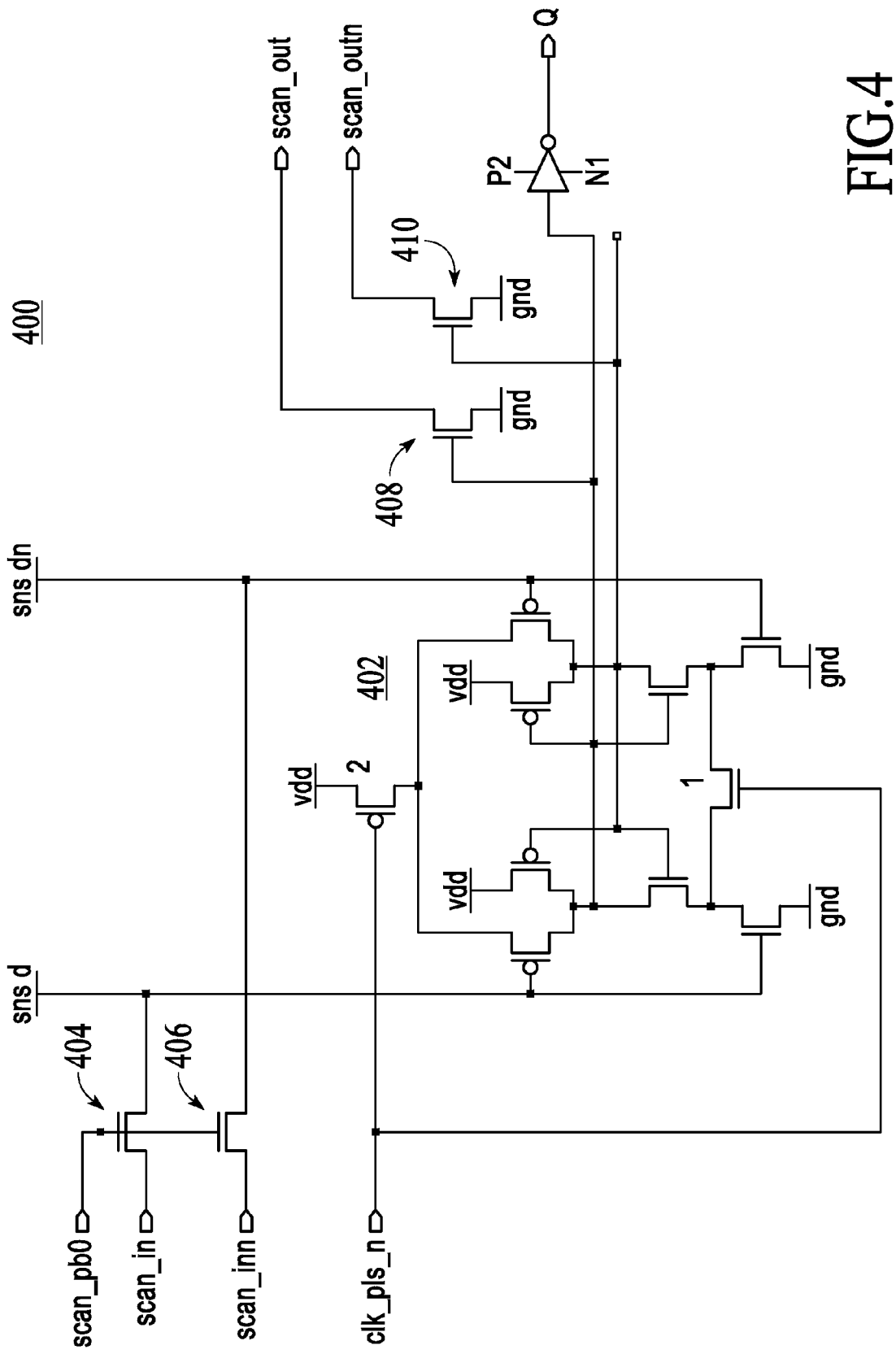
FIG. 4 is a transistor-level illustration of the output latch and scan multiplexer for a memory sense scan circuit, under an embodiment.

FIG. 4 is a transistor-level illustration of the output latch and scan multiplexer for a memory sense scan circuit, under an embodiment. Circuit 400 includes a latch 402 that consists of transistors 404 and 406. This latch circuit is pulsed on the rising edge of clock 202 and holds the data for a full clock period. The latch 402 is a transparent low type latch that has the feature that if both inputs are logic high, the latch holds the current value. The enable signal is pulsed low on the rising edge of the clock. This captures the output of the sense amplifier. There is a race between the capture of data in the latch, and the precharge of the sense amplifier. Since the precharge of the sense amplifier will drive both lines to one (logic high), the only care that needs to be taken is to provide enough time for the latch to switch. Once the latch has switched, the precharge of the sense amp will only cause the output latch to hold the same data.

For the scan circuitry, four transistors are added to the datapath, two of which are driven by the scan_ph0 signal (transistors 404 and 406, and two NMOS only output isolation devices (transistors 408 and 410). To scan data, the scan_ph0 line is selected instead of one of the column multiplexers. The scan_out and scan_outn signals from transistors 408 and 410 are for connecting to an adjacent read stage, and the Q output is for anything other than connecting to an adjacent read stage. In the same part of the clock cycle in which data would be read from the memory array, the sense amplifier is used to latch the value from the adjacent bit. On the next rising edge of the clock, it is then transferred to the output latch. The sense amplifier is used as the first half of the latch circuit for this purpose. The use of the sense amplifier in this manner effectively reduces the size of the output latch circuit for each memory cell in the array.

Memory Test Wrapper Interface

In one embodiment, the memory circuit of FIGS. 3 and 4 can be used in a memory test regime that scans in and out test vectors for execution of at speed tests. The test patterns are then processed and compared in test wrapper circuit that may be include a fan-out block. The test process generally involves scanning the test vectors into memory, applying the read addresses and write addresses, scanning out the data and comparing the scanned in and scanned out data. In one embodiment, the test process is an at speed test, which provides a much better indication of memory faults. The test regime utilizes the timing pattern illustrated in FIG. 2, that is, a precharge/read/precharge/write pattern. For at least two commands in a row, such a pattern comprises a read operation surrounded by write operations, and a write operation surrounded by read operations. In one embodiment, these surrounding operations are used to effectively sensitize the memory for at speed faults. For example, if a zero is being read, it can be preceded with a write one and followed by another write one. This at speed test will cause a failure if the next write drive happens early, or if the precharge before the read is weak. This results in a superior test scheme in which a next command may not necessarily stress the memory circuit to the same degree. Such a test scheme requires two write operations with possibly different data, and the ability to hold two commands for at two full clock cycles.

In general, the test procedure performed by the integrated test wrapper comprises executing back-to-back commands at speed and serially comparing the test data with the scanned data with integrated scan flip-flop circuits. The integrated test wrapper also implements an address padding mechanism to facilitate parallel testing of disparate size memories. This mechanism effectively pads all addresses so that maximal address and data can be scanned, with any excess data passing through the memory.

Embodiments of the test procedure and test wrapper circuit can be used with a core memory in which the memory circuits employ a timing sequence as shown in FIG. 2. In an alternative embodiment, the memory circuits can employ a conventional timing sequence as shown in FIG. 1A.

Figure 5A:
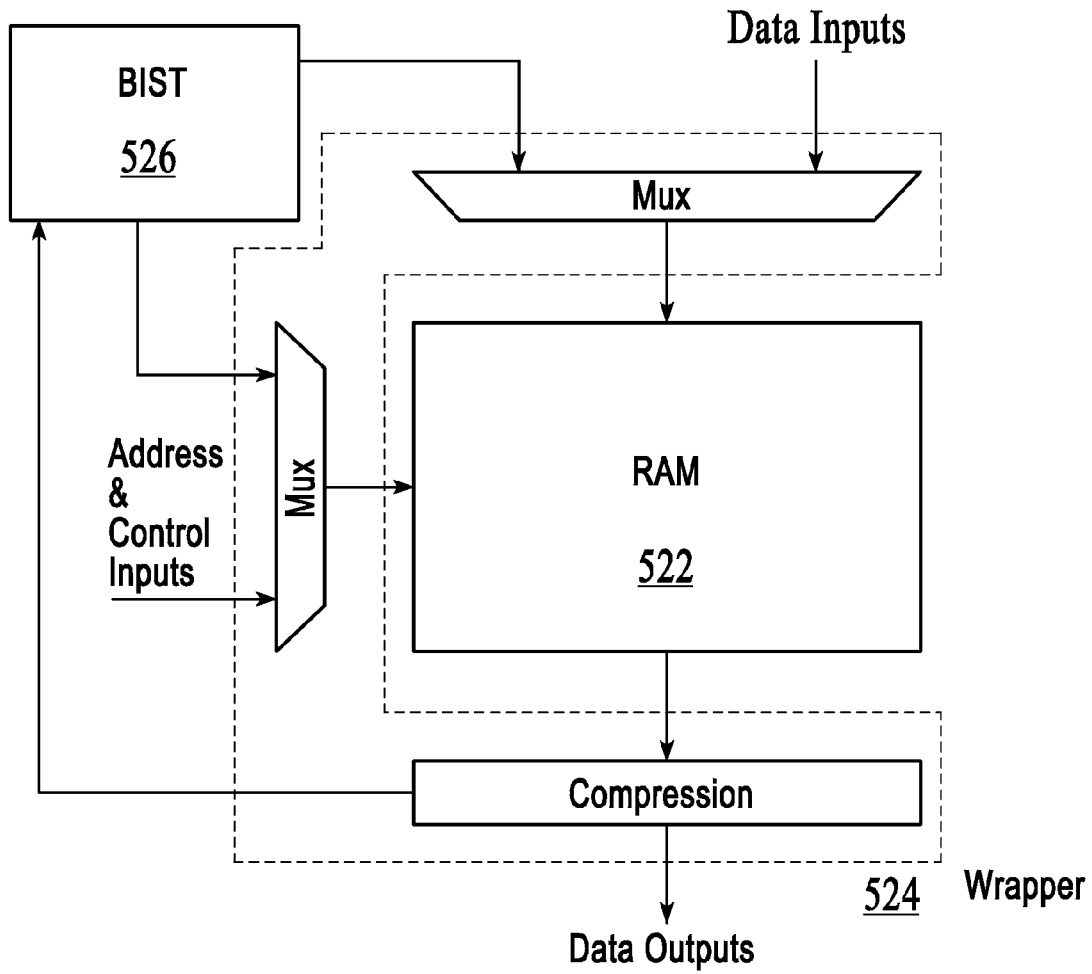
FIG. 5A illustrates the incorporation of a BIST component with a test wrapper for testing of a memory array, as currently known.

FIG. 5A illustrates the incorporation of a BIST component with a test wrapper for testing of a memory array, as currently known. As shown in circuit 520, a BIST component 526 issues commands to the memory array 522 to perform read and write operations to each memory cell of the array. The test wrapper interface consists of address and control circuitry, as well as data input and data output interface circuitry to perform the test signal transmission and compare functions for the memory 522.

Figure 5B:
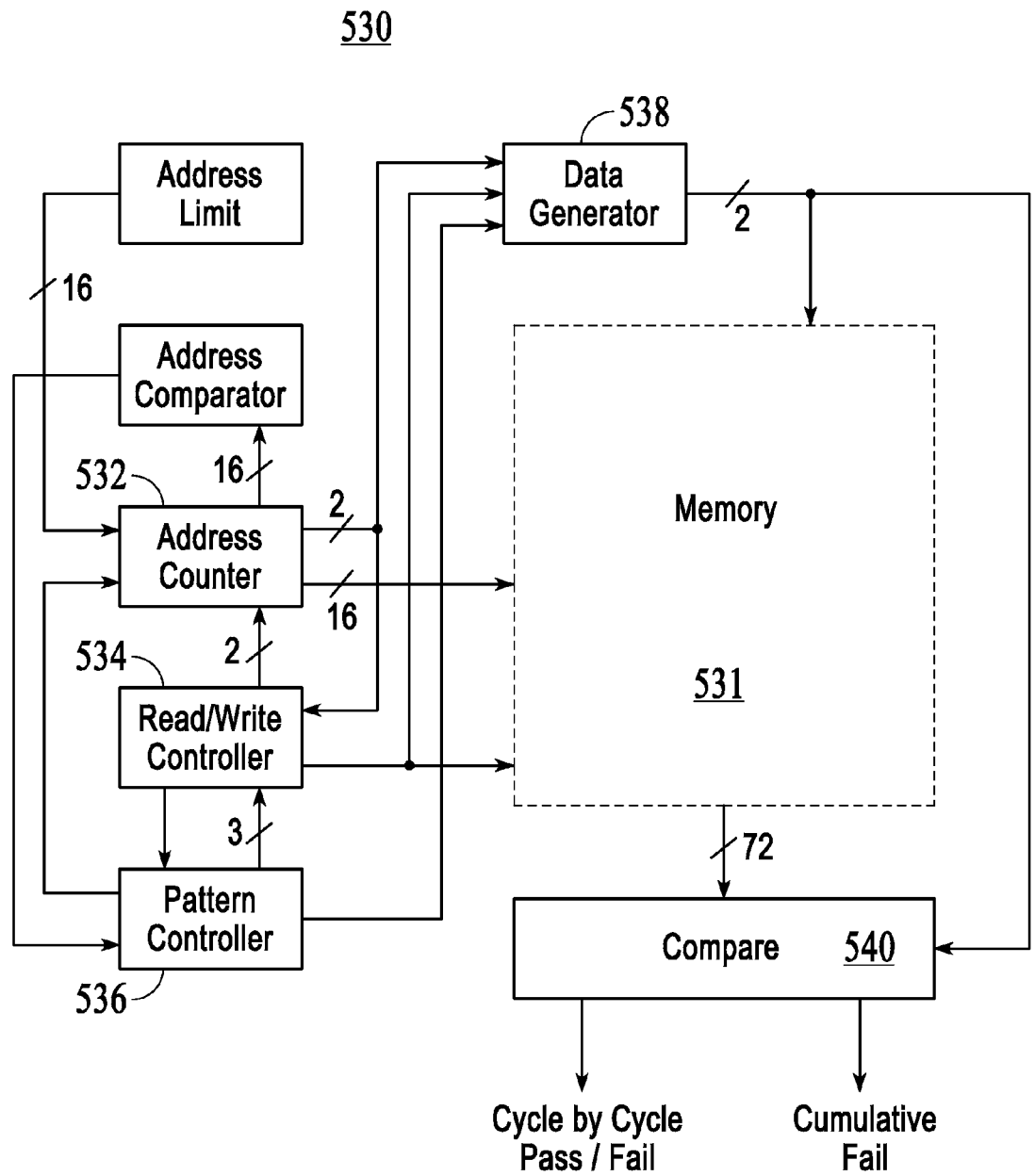
FIG. 5B is a block diagram that illustrates a conventional memory test wrapper, as known in the prior art.

FIG. 5B is a block diagram that illustrates a conventional memory test wrapper, as known in the prior art. The test wrapper 530 includes address control circuitry 532 to generate the appropriate address of the memory cell under test within memory array 531. The test pattern is generated by a pattern controller 536 and data generator 538, and a read/write controller 534 determines whether the test pattern is written to the memory or read from the memory. A comparator circuit 540 compares the test pattern written to the memory cell with the pattern that is read from the cell to determine whether or not the memory passes or fails the memory test. Depending upon the actual memory architecture and implementation, one or more elements of test wrapper 530 may be shared among multiple memory arrays within an overall system or may be incorporated as part of the memory circuit itself. For dual port memories, the test wrapper circuitry can become quite complex and occupy a significant amount of space on the memory die. An additional disadvantage associated with the test wrapper circuit of FIGS. 5A and 5B is that a test procedure that comprises the operations of scanning in a test pattern, applying the read address/write address, scanning the data out, and comparing the data, cannot be used to perform at-speed testing of the memory.

In one embodiment, a test wrapper circuit for interfacing a BIST module with a memory array utilizes integrated scan flip-flop circuits to perform serial compare operations on back-to-back commands for at-speed test operations. In order to implement effective at-speed testing capability, in one embodiment, the test pattern consists of at least two commands in a row with the following timing sequence: read/pre-charge/write/pre-charge/read/pre-charge/write/pre-charge. Alternatively, the sequence can be shifted to: pre-charge/read/pre-charge/write/pre-charge/read/pre-charge/write. These types of patterns result in a read operation preceded and followed by write operations, and a write operation preceded and followed by read operations. This pattern effectively sensitizes the memory for detection of at-speed faults. For at-speed tests it is generally more effective, when trying to read a zero, to write a one before and after the zero. Likewise, when trying to read a one, it is better to write a zero before and after the one. This type of test pattern will generally catch faults due to weak pre-charge steps or early write operations.

Figure 6A:
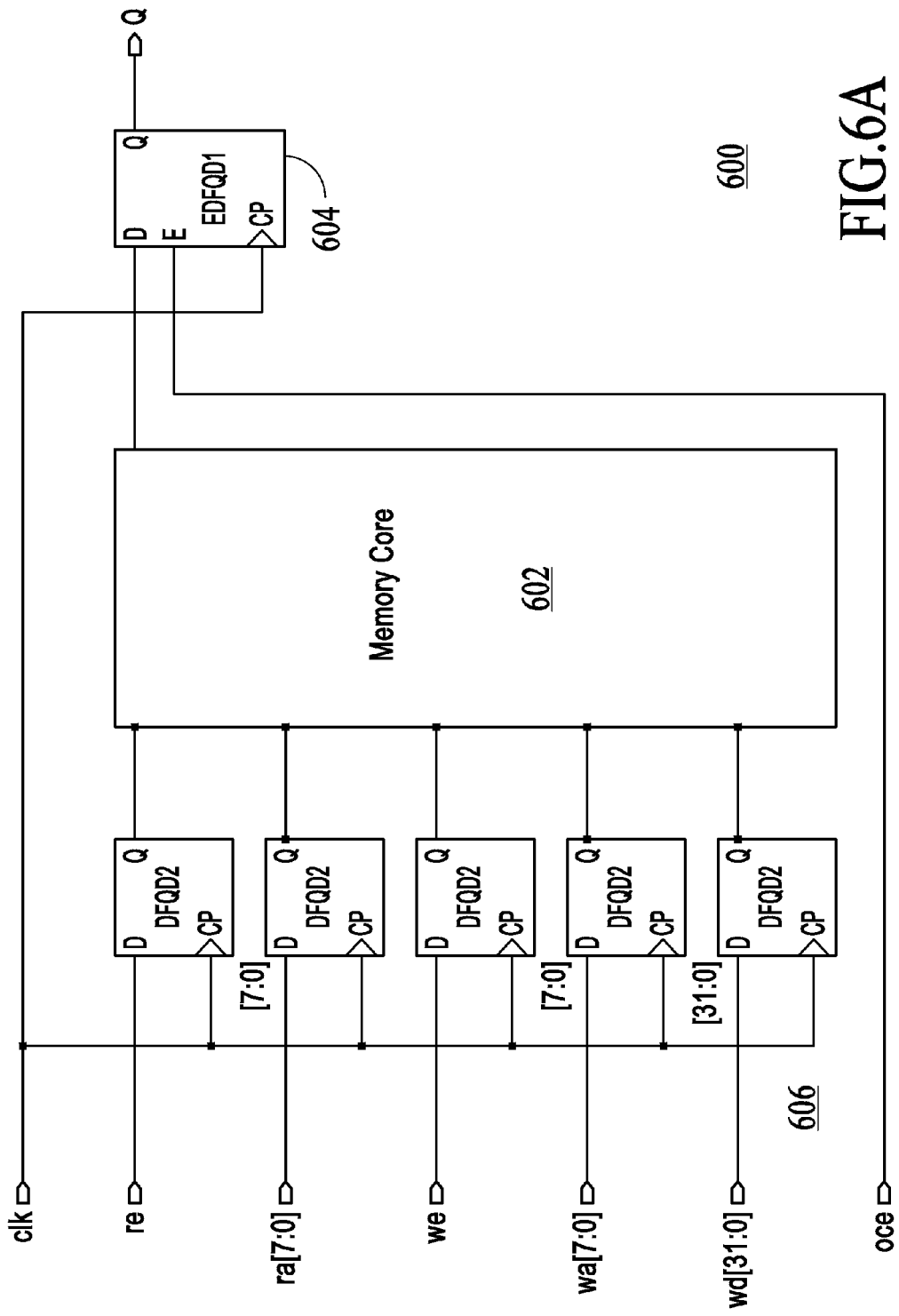
FIG. 6A illustrates a memory circuit that can be used in conjunction with a memory test interface, under an embodiment.

FIG. 6A illustrates a memory circuit that can be used in conjunction with a memory test interface, under an embodiment. Memory circuit 600 comprises a memory core 602 and peripheral control logic including output circuit 604 and input circuitry 606 for controlling the reading and writing of data to and from the memory core 602. In one embodiment, the memory core 602 can include a plurality of memory cells incorporating a sense amplifier circuit as illustrated in FIG. 3. The memory circuit 600 may be embodied in embedded RAM applications, and that can be used with a fully integrated test wrapper that facilitates a built-in self-test (BIST) mechanism for production testing of the memory IC. The BIST mechanism verifies all or a portion of the memory operation of the IC. A test wrapper is integrated with the memory circuit to receive test information scanned in from a BIST processor. Logic circuitry associated with the test wrapper is configured to generate the address, data, and command signals based on the scanned test information.

FIG. 6B illustrates the memory circuit of FIG. 6A including a fully integrated test wrapper, under an embodiment. The test wrapper circuit includes registers 622-630. Registers 622 and 624 generate a second set of read addresses (RAI[n:0]), and registers 626 and 628 generate a second set of write addresses (WAI[n:0]). An OCE control signal 612 is used to select whether the output DQ register 614 should capture the result of the first or second read operation. A write pattern register 610 provides the write data for the extra write operation. This is a two-bit pattern that is repeated across the memory. For a 256-bit word memory, a test wrapper, such as that shown in FIG. 6B adds eight read and write address lines and two read enable and write enable lines, and approximately six other control lines. For the embodiment in which the memory core utilizes memory circuits as illustrated in FIG. 3, the latches are all scannable.

Figure 7:
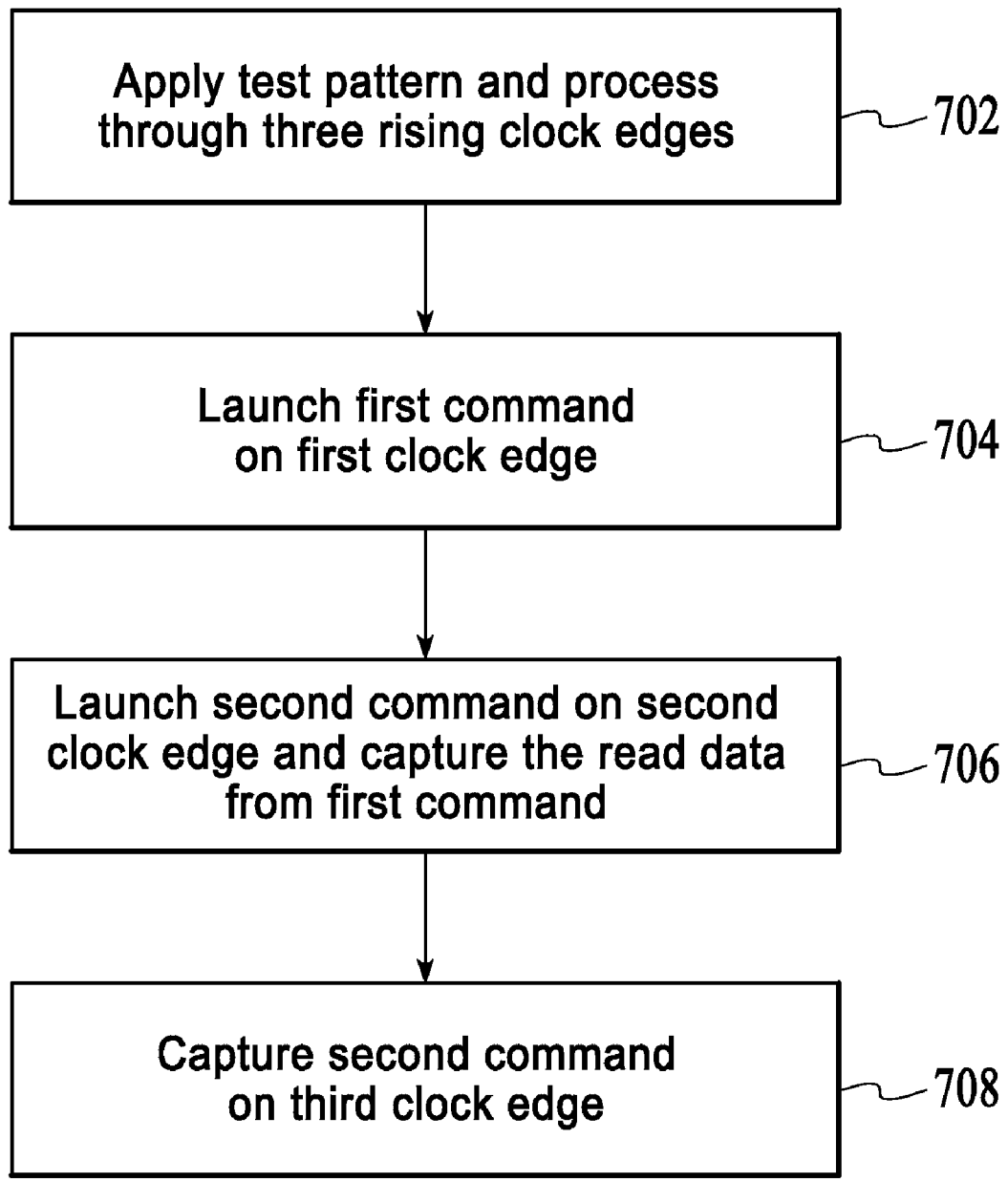
FIG. 7 is a flowchart that illustrates the timing sequence for performing a boundary-scan test, according to an embodiment.

For the embodiment illustrated in FIG. 6B, the test wrapper operates with two basic input signals denoted mtst_scan 618 and atpg_cmd 616. When operating in ATPG mode, memory operation is disabled, and the write, read, and address registers have no value. In the MTST_SCAN mode, all of the registers in the memory are connected into a single scan chain, and the memory operation is disabled to prevent accidental triggering. The MTST mode is used to perform the test scan operation. FIG. 7 is a flowchart that illustrates the timing sequence for performing a boundary-scan test, according to an embodiment. The MTST_SCAN process begins by applying a test pattern, block 702. The test step using this pattern uses three rising edges of a clock signal, and is operated at a desired frequency for performing an at speed test. The first clock edge launches the first command, block 704. The second clock edge launches the second command, and also captures the read data from the first command, block 706. The third clock edge then captures the second command. During the test procedure, the process of scanning in a new command causes the result data to be scanned out. In one embodiment, the order of the scan chain is: address/control→wd[n:0]→dq[n:0].

Figure 8:
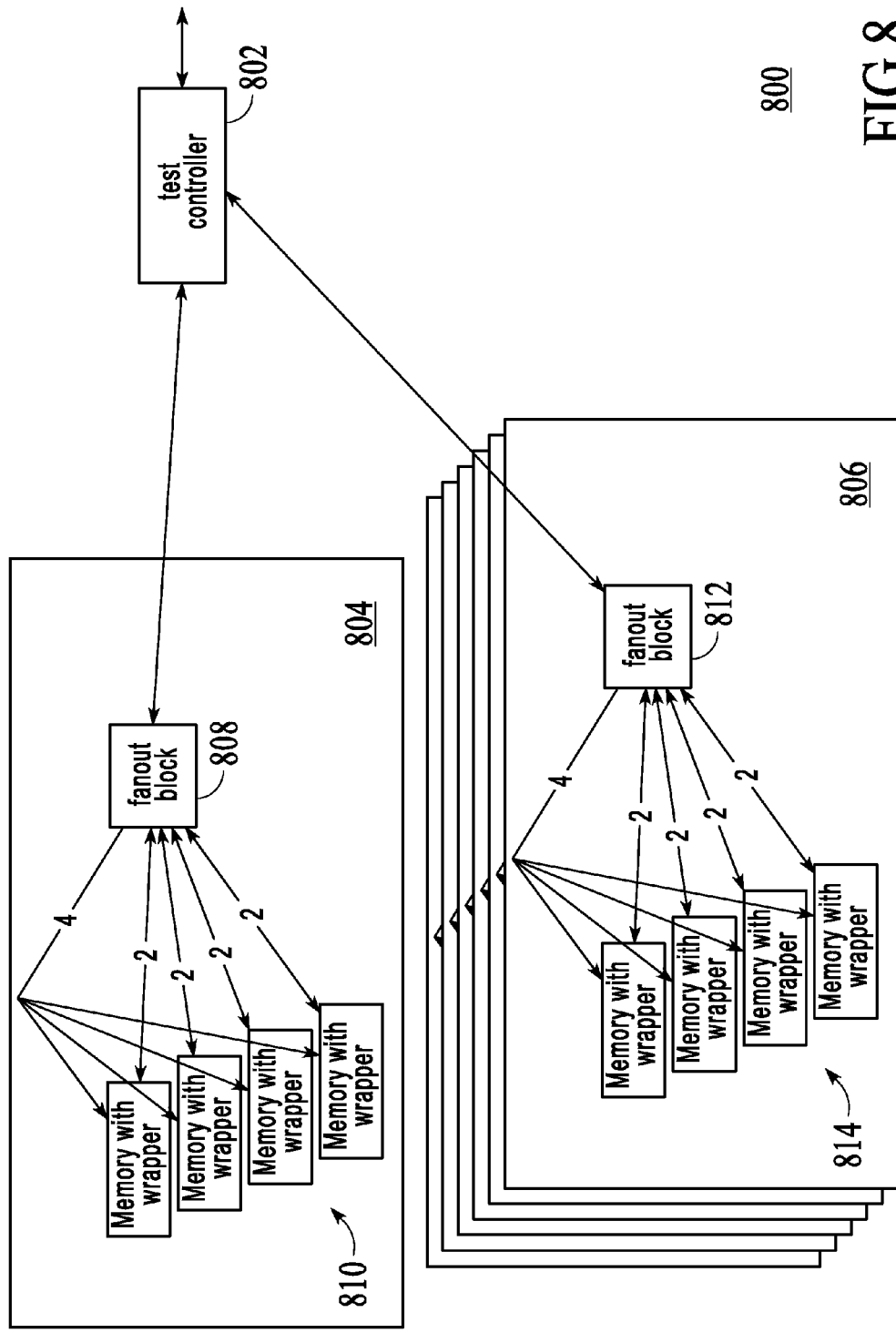
FIG. 8 illustrates a fanout block system that applies a test pattern to a number of memories, under an embodiment.

The test wrapper circuit of FIG. 6 can be used in an overall test structure that propagates the memory command from a test controller and applies it to a number (N) of memories in parallel. FIG. 8 illustrates a test structure that applies the test pattern to a number of memories, under an embodiment. In test structure 800, a test controller generates test patterns and compares the scanned in and scanned out data patterns to determine the quality and proper operation of the memory devices under test. The test controller can be configured to transmit the test patterns to any number of memory test blocks, such as memory test blocks 804 and 806. Each memory test block contains a number of memories that include an integrated test wrapper circuit, such as that illustrated in FIG. 6. Each memory test block also includes its own fanout block, 808 and 812. Each fanout block propagates the test pattern and control signals to all of the integrated test wrapper memories within its memory test block. Thus, as shown in FIG. 8, fanout block 808 propagates the test signals from test controller 802 to memory devices 810 within block 804, and fanout block 812 propagates these same test signals to memory devices 814 within block 806.

In one embodiment, the test structure 800 operates from a chip clock tree that operates at full clock speed so that at speed testing is performed. The scan paths from each fanout block to their respective memories is constrained to be single cycle at speed. If necessary, additional pipeline registers can be added. An extra clock gate signal is also driven from the fanout block, and is used to gate the clock for the test/scan operation. This clock gate component can also be integrated into the test wrapper circuit.

Figure 9:
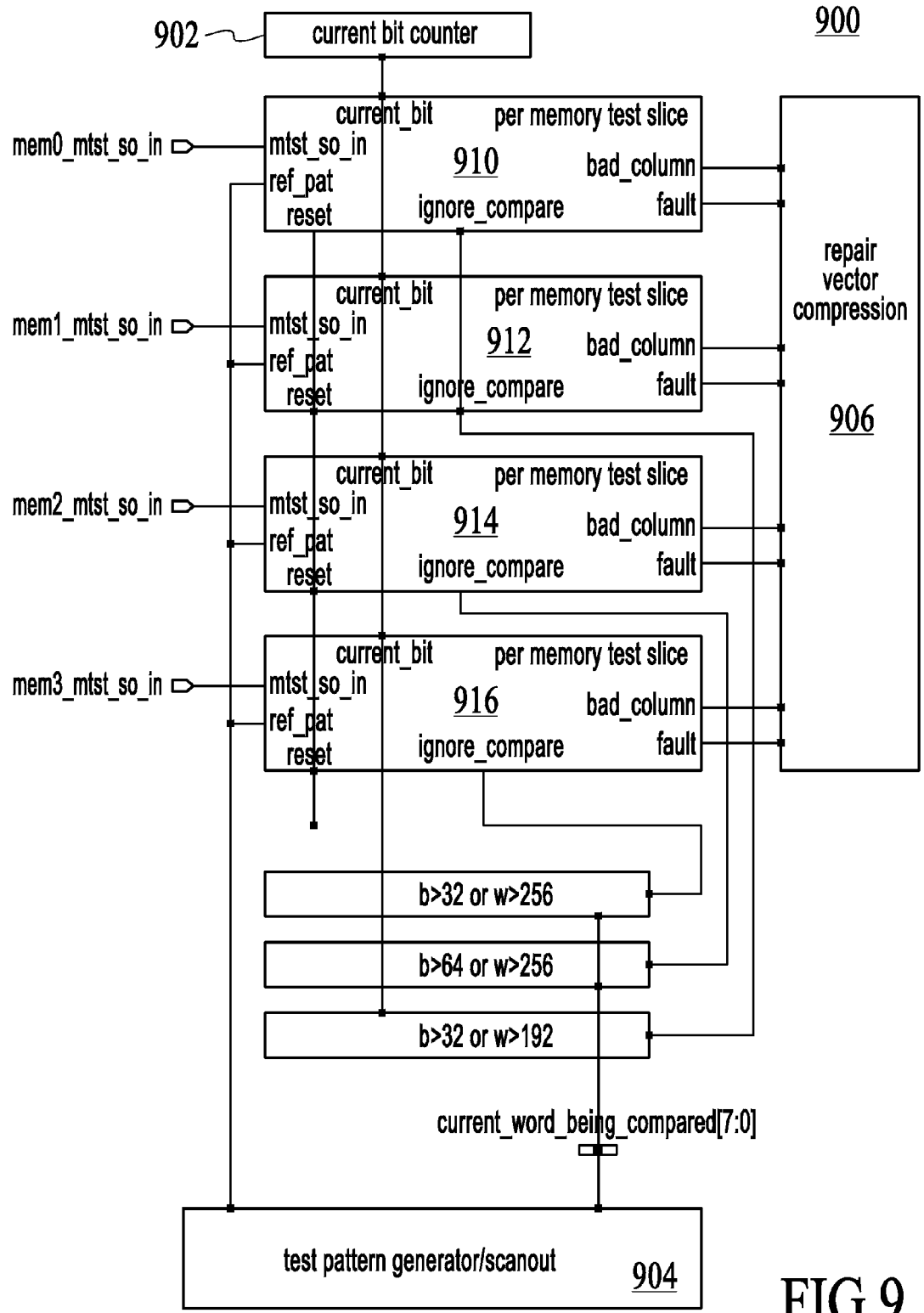
FIG. 9 is a block diagram of a fanout block for the test structure of FIG. 8, under an embodiment.

FIG. 9 is a block diagram of a fanout block for the test structure of FIG. 8, under an embodiment. The fanout block 900 of FIG. 9 is a one-to-four block that propagates test and control signals to four different integrated test wrapper memories. Such a fanout block can be configured to work with any number of memory devices. Fanout block 900 includes a per-memory test slice circuit 910-916 for each memory to which it is connected. Each test slice circuit receives input from a test pattern generator 904, which is controlled by a current bit counter 902. Each test slice circuit receives a test pattern as a reference pattern. It also receives a corresponding pattern from its respective memory and performs a compare operation on the two patterns. Any memory faults are passed on to a repair vector compression circuit 906.

In one embodiment, the fanout block is configured to operate with memories that are of the same size. However, in certain applications, the memories under test may not all be of the same size. One solution is to separate each fanout block for each different size of memory. Alternatively, the test structure employs a method that tests all possible memory sizes in parallel with a single wrapper. The test pattern is applied to accommodate the largest memory within the array. Each memory includes a pin that is configured to cause the memory to ignore test patterns that are too large or portions of test patterns that exceed the size of the memory. Thus, any memory that is smaller than the largest size would ignore the larger test patterns or excess portions of the test patterns. For this embodiment, the scan chain length for the commands is the same for all memories. For example, if the largest memory was 512 words, a 64-bit deep memory would need 12 (3*4) dummy registers on the MTST_SCAN chain. This mechanism would line up the data and command words on all of the memories. Full width data is sent to all memories, and simply scans through in the smaller memories. In comparison step, only the number of bits that correspond to the width of the memory are considered, and the rest are ignored. Entire steps that apply to words not in the memory are also ignored.

Figure 10:
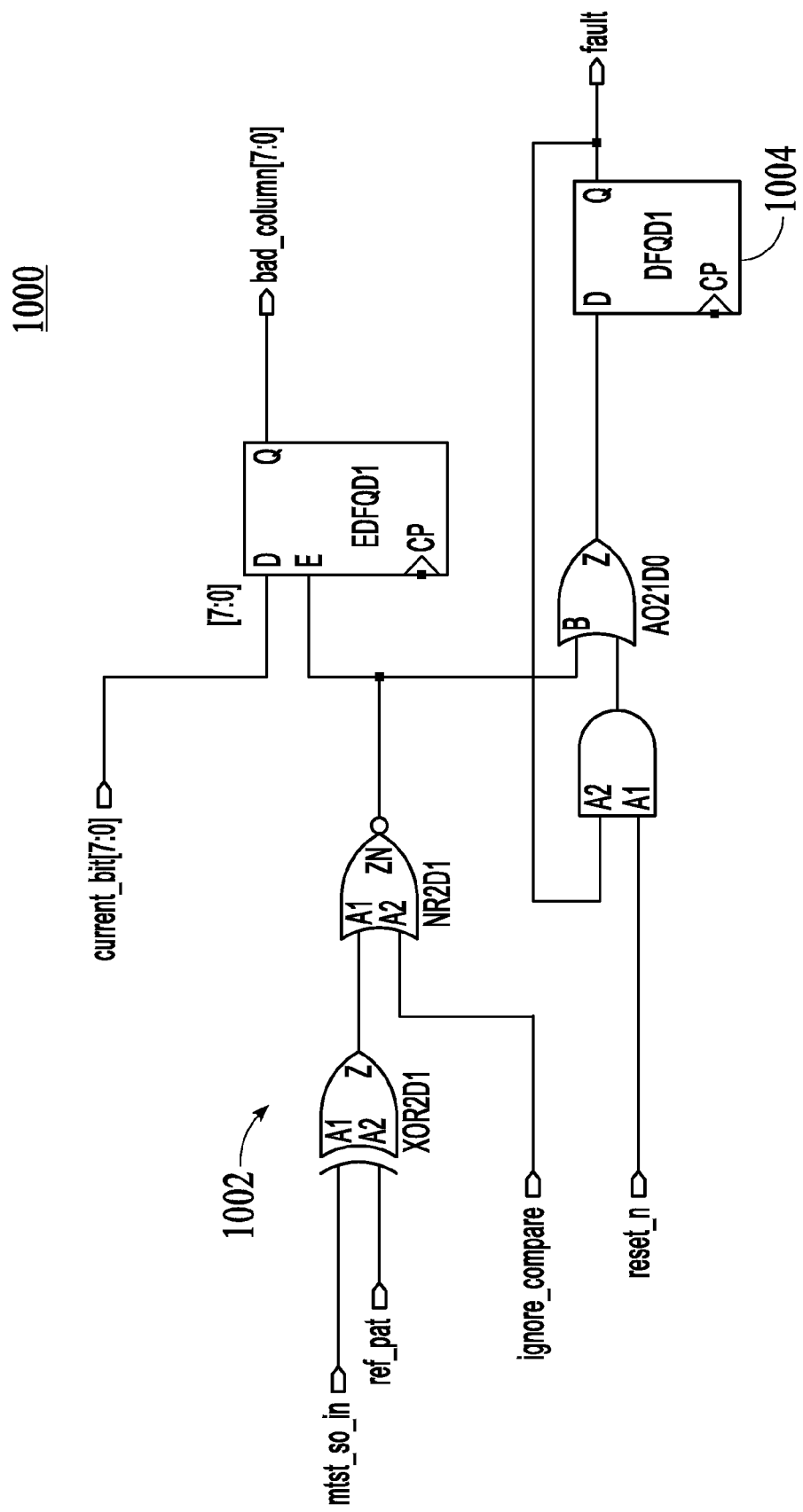
FIG. 10 is a gate-level illustration of a per-memory test slice circuit for the fanout block of FIG. 9, according to an embodiment.

FIG. 10 is a gate-level illustration of a per-memory test slice circuit for the fanout block of FIG. 9, according to an embodiment. As shown in circuit 1000, a first logic stage receives the reference pattern from the test pattern generator and the pattern scanned in from the memory block and performs a comparison operation. The result of the comparison operation is then passed through flip-flop 1004, which generates a fault signal in the event of a mismatch between the reference pattern and the scanned in pattern.

In one embodiment, the memory circuit and test scheme can be any type of random access memory device that can be used in or integrated in any type of processor, co-processor, arithmetic logic units, or other processing units. Such a processing unit can be a Graphics Processing Unit (GPU), or Visual Processing Unit (VPU), which is a dedicated graphics rendering device for a personal computer, workstation, or game console.

Aspects of the memory circuitry and test methodology may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: microcontrollers with memory (such as EEPROM), embedded microprocessors, firmware, software, etc. Furthermore, aspects of the memory test process may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, and so on).

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the memory test process is not intended to be exhaustive or to limit the embodiments to the precise form or instructions disclosed. While specific embodiments of, and examples for, processes in graphic processing units or ASICs are described herein for illustrative purposes, various equivalent modifications are possible within the scope of the disclosed methods and structures, as those skilled in the relevant art will recognize.

The elements and acts of the various embodiments described above can be combined to provide further embodiments. These and other changes can be made to the dynamic leakage control system in light of the above detailed description.

In general, in the following claims, the terms used should not be construed to limit the disclosed method to the specific embodiments disclosed in the specification and the claims, but should be construed to include all operations or processes that operate under the claims. Accordingly, the disclosed structures and methods are not limited by the disclosure, but instead the scope of the recited method is to be determined entirely by the claims.

While certain aspects of the disclosed embodiments are presented below in certain claim forms, the inventors contemplate the various aspects of the methodology in any number of claim forms. For example, while only one aspect may be recited as embodied in machine-readable medium, other aspects may likewise be embodied in machine-readable medium. Accordingly, the inventors reserve the right to add additional claims after filing the application to pursue such additional claim forms for other aspects.

What is claimed is:

1. A scannable input/output circuit for a memory device comprising:
   a sense amplifier receiving one or more bitlines, the sense amplifier comprising a first latch circuit functioning as a scan input circuit when the memory device is operated in a scan mode; and
   a second latch circuit coupled to the sense amplifier, the second latch circuit producing an output based on data transmitted over the bitlines;
   a multiplexer coupled to the sense amplifier;
   a clock circuit coupled to the one or more bitlines; and
   a test pattern receive circuit synchronized with the clock circuit, and configured to receive test commands comprising a read pre-charge cycle triggered off of a rising edge of a clock signal generated by the clock circuit, a read command following the read-precharge cycle, a write-precharge cycle triggered off of a falling edge of the clock signal, and a write command following the write pre-charge cycle.

2. The input/output circuit of claim 1, wherein the memory device is coupled to at least one other memory device, the input/output circuit further comprising a repair multiplexer circuit coupled to the second latch circuit and configured to bypass the memory device in the event of a fault caused by a circuit failure or bit failure in the memory device.

3. The input/output circuit of claim 1, wherein the memory device is coupled to at least one other memory device, the input/output circuit further comprising a scan multiplexer circuit coupled to the sense amplifier, wherein the sense amplifier is configured to hold data for a full clock period when it is pulsed on the rising edge of the clock during a scan operation.

4. The input/output circuit of claim 1 wherein the memory device comprises at least a portion of a memory system that includes an integrated test wrapper circuit, the integrated test wrapper circuit comprising scan flip-flop circuits on both the input and output portions of the memory device and a comparator circuit to compare a test pattern input over the bitlines to a pattern stored in the memory in response to the test pattern.

5. The input/output circuit of claim 4 wherein the test pattern comprises a portion of a test routine consisting of back-to-back commands each command consisting of sequentially alternating logic low and logic high bits.

6. A method comprising:
   transmitting a read-precharge cycle on a rising edge of a clock signal;
   transmitting a read command following the read-precharge cycle;
   transmitting a write-precharge cycle on a falling edge of a clock signal;
   transmitting a write command following the write-precharge cycle;
   storing data corresponding to the read command in a sense amplifier after initiation of the write-precharge cycle; and
   storing data corresponding to the write command in a latch coupled to the sense amplifier after initiation of the write command.

7. The method of claim 6 wherein the memory device is coupled to a plurality of other memory devices through an integrated test wrapper including integrated scan flip-flop circuits coupled to the memory device, the method further comprising:
   scanning a test pattern into the memory device;
   scanning a stored pattern out of the memory device;
   comparing the test pattern to the stored pattern; and
   causing the memory device to be bypassed if the test pattern does not match the stored pattern.

8. The method of claim 7 wherein the plurality of memory devices comprise at least some memory devices that are of different sizes, the method further comprising:

padding the addresses of the memory device locations to accommodate scanning of a maximum size address length and data size; and passing through data that exceeds a maximum address length data size for the memory device.

9. A memory system comprising:

an addressable memory array; and a memory test subsystem performing at-speed memory tests of the memory array by transmitting a read-precharge cycle on a rising edge of a clock signal, transmitting a read command following the read-precharge cycle, transmitting a write-precharge cycle on a falling edge of a clock signal; and transmitting a write command following the write-precharge cycle.

10. The memory system of claim 9 further comprising a scan circuit coupled to the memory test subsystem configured to decode read and write address, scan-in data comprising test pattern data and scan-out data comprising stored data wherein a test pattern generator coupled to the memory test subsystem generates back-to-back commands consisting of test patterns.

* * * * *